(12) United States Patent
Smith et al.

(10) Patent No.: US 7,124,390 B2
(45) Date of Patent: Oct. 17, 2006

(54) GENERATING A SPLIT POWER PLANE OF A MULTI-LAYER PRINTED CIRCUIT BOARD

(75) Inventors: Daniel J. Smith, Crystal Lake, IL (US); Edwin F. Smith, Huntsville, AL (US)

(73) Assignee: Mentor Graphics Corporation, Wilsonville, OR (US)

( * ) Notice: Subject to any disclaimer, the term of this patent is extended or adjusted under 35 U.S.C. 154(b) by 110 days.

(21) Appl. No.: 10/627,056

(22) Filed: Jul. 25, 2003

(65) Prior Publication Data

US 2005/0022149 A1 Jan. 27, 2005

(51) Int. Cl.
*G06F 17/50* (2006.01)
(52) U.S. Cl. .............................. 716/15; 716/12; 716/13; 716/14
(58) Field of Classification Search .................... 716/2, 716/8–15; 174/250, 255, 256, 260, 261; 361/760, 777, 780, 792, 793–794
See application file for complete search history.

(56) References Cited

U.S. PATENT DOCUMENTS

| | | | |
|---|---|---|---|
| 4,613,941 A * | 9/1986 | Smith et al. ................... 716/12 |
| 6,465,890 B1 * | 10/2002 | Poddar et al. ............... 257/773 |
| 6,670,633 B1 * | 12/2003 | Mayberry ..................... 257/48 |
| 6,829,757 B1 * | 12/2004 | Teig et al. ..................... 716/12 |
| 2004/0245011 A1 * | 12/2004 | Amparan et al. ........... 174/250 |

OTHER PUBLICATIONS

Das et al., "Channel Routing in Manhattan-Diagonal Model," IEEE, Jan. 1996, pp. 43-48.*

T. Hubing et al., Preliminary Embedded Capacitance Measurement Results, NCMS Embedded Capacitance Project, Oct. 23, 1999, 25 pp.

Todd Hubing et al., Power Bus Noise Reduction Using Power Islands in Printed Circuit Board Designs, University of Missouri-Rolla Electromagnetic Compatibility Laboratory, Nov. 11, 1999, 11 pp.

Todd Hubing, Prof., University of Missouri-Rolla, PWB Power Bus Structures: Theory and Design, University of Missouri-Rolla Electromagnetic Compatibility Laboratory, IEEE EMC Society Rocky Mountain Chapter, Nov. 11, 1999, 24 pp.

Istvan Novak et al., SUN Microsystems, Inc., Simulating Complex Power-Ground Plane Shapes With Variable-Size Cell SPICE Grids, Manuscript for the 11th Topical Meeting on Electrical Performance of Electronic Packaging Oct. 21-23, 2002, Monterey, CA.

* cited by examiner

*Primary Examiner*—Vuthe Siek
(74) *Attorney, Agent, or Firm*—Banner & Witcoff, Ltd.

(57) ABSTRACT

Methods and apparatuses generate a split power plane for a multiplayer printed circuit board (PCB). An aspect of the invention supports the generation of a split power plane by constructing wireframes corresponding to each of the power voltages. If a crossover between different voltage wireframes exists, at least one of the voltage wireframes may be modified in order to eliminate the crossover. With another aspect of the invention, a trace layout, corresponding to the wireframe, is constructed in accordance with electrical current requirements, e.g. average electrical current and peak electrical current, of the associated components. With another aspect of the invention, a plane that contain the traces that associated with a power voltage may be enhanced by increasing the associated area of the layout in accordance with the available area of the split power plane. The enhancement of a plane may be prioritized in accordance with peak electrical current that is associated with the plane.

32 Claims, 14 Drawing Sheets

GENERATING A SPLIT POWER PLANE OF A MULTI-LAYER PRINTED CIRCUIT BOARD

FIELD OF THE INVENTION

The present invention relates to multi-layer printed circuit boards. More particularly, this invention relates to automatically designing a split plane layer that supports a plurality of power potentials or ground potentials.

BACKGROUND OF THE INVENTION

The trend of the electronic industry is to provide increasingly powerful electronic circuitry. A major reason of this trend is that electronic components, such as integrated circuits, are becoming increasingly complex. Thus, printed circuit board layouts are becoming more densely packed with electronic components. Moreover, electronic circuitry often requires power sources having different power voltages, where isolated electronic circuits may require separate power supplies for circuit stability.

A multi-layer printed circuit board (PCB) is often used to support complex electronic circuitry. A multi-layer PCB has a plurality of layers, ranging from a few layers to approximately a hundred layers. Each layer may support signal connectivity and/or power connectivity, where layers may be connected to each other using plated holes. A multi-layer PCB is typically formed by laminating sections of core material in which copper is deposited on each side of the core material. Electronic components typically reside on the outside layers of the PCB. The inner layers typically support signal connectivity between the electronic components as well as power connectivity between power sources and electronic components. In order to provide connectivity between layers of the multi-layer PCB, power vias and signal vias are positioned to complete desired connectivity. (A via is essentially a metal lined hole whose terminations can be made on both outer layers, on one inner layer and one outer layer, or within any of the PCB's inner layers.) At least one layer, called a split plane layer, is dedicated to support the distribution of multiple power potentials (or ground potentials) for the electronic components. As the number of power potentials for the multi-layer PCB increases, the complexity of the split plane layer layout increases.

The creation of a split plane layer may require substantial manual intervention by the designer and is often time consuming. The plane shape of the split plane layer is based upon the positioning of each power via. Moreover, the designer must assure that every pin of an electronic component receives the correct amount of current by verifying that each area of connectivity has sufficient area and that signal vias do not disrupt the anticipated current handling capability. When the designer begins to create a split plane layer, the designer must create a plane shape based on the present location of each power potential's vias.

With the increasing complexity of electronic circuitry, the effort to design a split plane layer increases. Thus, methods and apparatuses that reduce this effort are beneficial in the design of multi-layer printed circuit boards.

BRIEF SUMMARY OF THE INVENTION

The present invention provides methods and apparatuses for a generation of a split power plane of a multi-layer printed circuit board (PCB). An aspect of the invention supports the generation of a split power plane by constructing wireframes corresponding to each of the power voltages. If a crossover between different voltage wireframes exists, at least one of the voltage wireframes may be transformed in order to eliminate the crossover. With another aspect of the invention, a trace layout, corresponding to the wireframe, is constructed in accordance with electrical current requirements, e.g. average electrical current and peak electrical current requirements, of the associated components.

With another aspect of the invention, a plane that contain the traces to distribute a power voltage may be enhanced by increasing the associated area of the layout in accordance with the available area of the split power plane. The enhancement of a plane may be prioritized in accordance with peak electrical current that is associated with the plane. Other embodiments may utilize other electrical characteristics to determine the priority.

BRIEF DESCRIPTION OF THE DRAWINGS

Illustrative embodiments of the present invention are illustrated by way of example in the accompanying drawings. The drawings are not, however, intended to limit the scope of the present invention. Similar references in the drawings indicate similar elements.

DETAILED DESCRIPTION

Definitions for the following terms are included to facilitate an understanding of the detailed description.

milling path—A milling path is a user-defined path for a CNC router (with a drill bit of a pre-determined diameter) to create a) material-free shapes within a board design outline (either partially up to completely through the Z-axis), or b) the board design outline itself.

route obstruct—A route obstruct is any user-defined shape (line, circle, rectangle, polygon, etc. . . . ) that is placed within the route border that is used to keep out traces and vias from being added within its perimeter.

plane obstruct—A plane obstruct is any user-defined shape (line, circuit, rectangle, polygon, etc.) that is placed within the route border that is used to keep out copper planes from being added within its perimeter.

route border—A route border is a user-defined shape (generally a similar but smaller shape that resides within the board outline) that defines the area where all circuit connections (traces, vias, and copper planes) are generated within.

Figure 1:
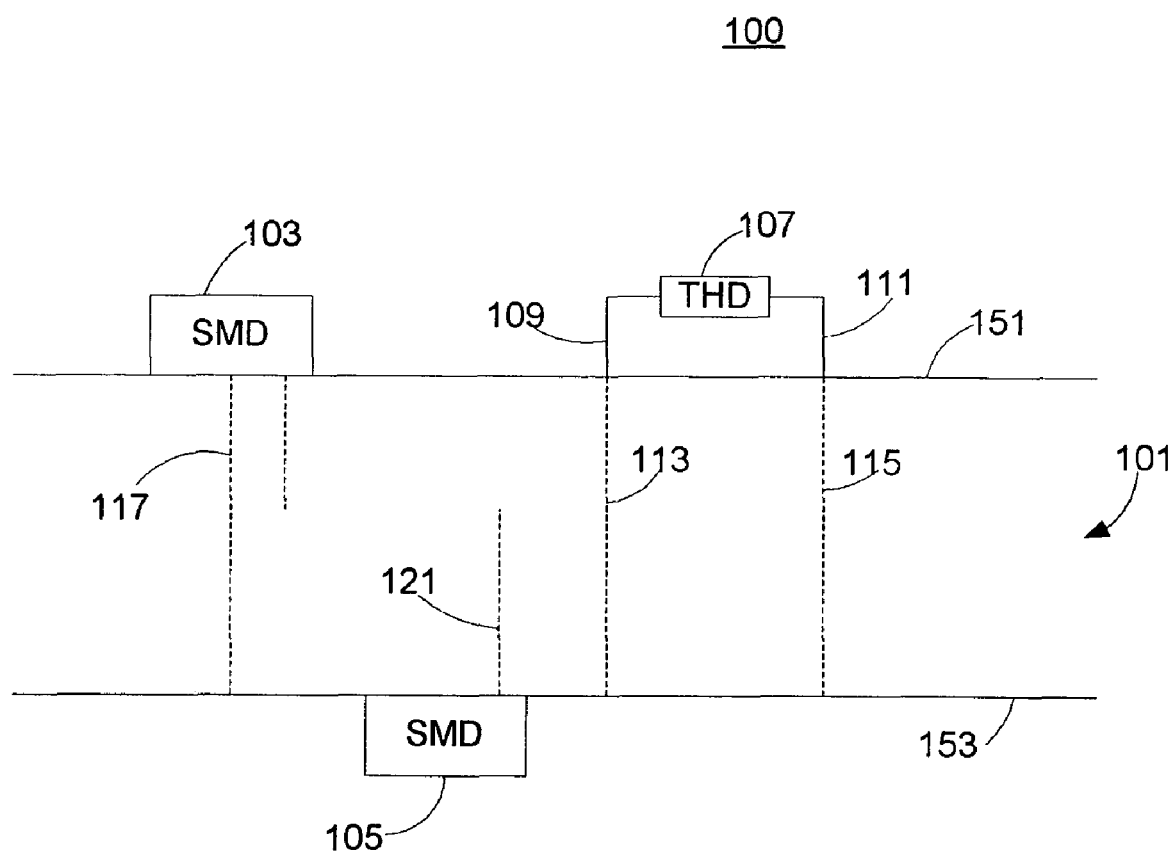
FIG. 1 illustrates a multi-layer printed circuit board (PCB) with mounted components in accordance with an embodiment of the invention.

FIG. 1 illustrates a multi-layer printed circuit board (PCB) 100 with mounted components in accordance with an embodiment of the invention. The multi-layer PCB 100 comprises an unpopulated multi-layer printed circuit board 101 and a plurality of components, including surface mount devices (SMD) 103 and SMD 105 and a through-hole device (THD) 107. (The embodiment may support through-hole devices that are axial-leaded or radial-leaded, including capacitors, inductors, resistors, diodes, and other types of through-hole devices.) The PCB 100 is typically populated with additional components, where the components are mounted on outside two layers 151 and 153. In the example shown in FIG. 1, the PCB 101 has a plurality of layers, including the two outer layers 151 and 153 and at least one inner layer (not shown). The inner layer may support signal paths between components (e.g. between the SMD 103 and the SMD 105 and between the SMD 103 and the THD 107) and may support ground paths and power paths between power sources and the components.

Referring to the example in FIG. 1, the SMD 103 is electrically connected to the SMD 105 through a plated hole 117, which may be referred as a through-hole via. The through-hole via 117 penetrates layers of the PCB 101 and is plated with an electrically conductive material (e.g. copper, silver, tin or metal alloy) so that a designated pin of the SMD 103 is electrically connected to a designated pin of the SMD 105. A blind plated hole, which may be referred as a blind via, does not penetrate all the layers of the PCB 101 but terminates at an inner layer, where the inner layer (which may support a split power plane) provides electrical power for the SMD 103. Similarly, a blind via 121 terminates at the inner layer to provide electrical power for the SMD 105. The SMD 103 and the SMD 105 may utilize a plurality of power sources that are associated with different electrical potentials (voltages), where additional power vias provide connectivity to the additional power sources.

The THD 107 may be connected to the SMD 103 through a trace on an outer layer that is connected to a lead 109 or a lead 111 and that is connected to the SMD 105 through a plated hole 113 or 115.

Figure 2:
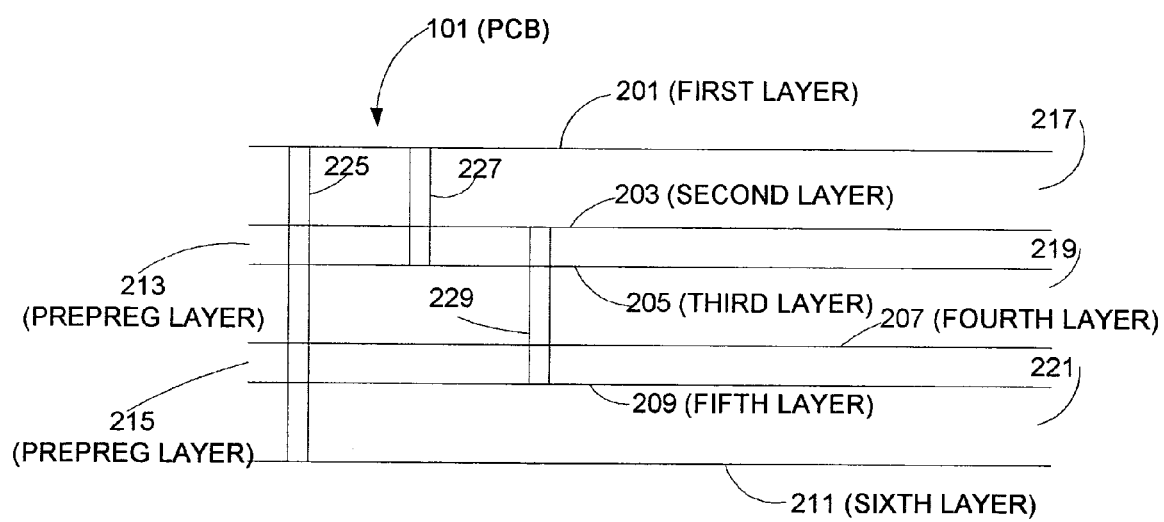
FIG. 2 shows a cross section of the multi-layer PCB as shown in FIG. 1.

FIG. 2 shows a cross section of the multi-layer PCB 101 as shown in FIG. 1. In the example shown in FIG. 2, the PCB 101 has six layers, including two outer layers 201 and 211 and four inner layers 203, 205, 207, and 209. The layers 201 and 203 reside on outer surfaces of a base material core 217, the layers 205 and 207 reside on outer surfaces of a base material core 219, and the layers 209 and 211 reside on outer surfaces of a base material core 221. The layers 201–211 are laminated together by inserting prepreg layers 213 and 215. (The prepreg layers 213 and 215 typically are a composite dielectric comprising a thermoset resin.)

In the example shown in FIG. 2, a through-hole via 225 electrically connects the first layer 201 and the sixth layer 211. Also, a blind via 227 connects the first layer 201 and the third layer 205, and a buried via 229 electrically connects the second layer 203 and the fifth layer 209.

One of the layers (e.g. the second layer 203) distributes electrical power to the components of the PCB 101. The components may be powered at different electrical potentials, and consequently the second layer 203 may distribute electrical power at different electrical potentials. In other exemplary embodiments, an additional layer (e.g. the fourth layer 207) may distribute power at other electrical potentials. A ground potential is typically supported by another layer (e.g. the third layer 205). If separate ground potentials are required, the third layer 205 may support a plurality of ground potentials or a different layer may be configured accordingly.

Figure 3:
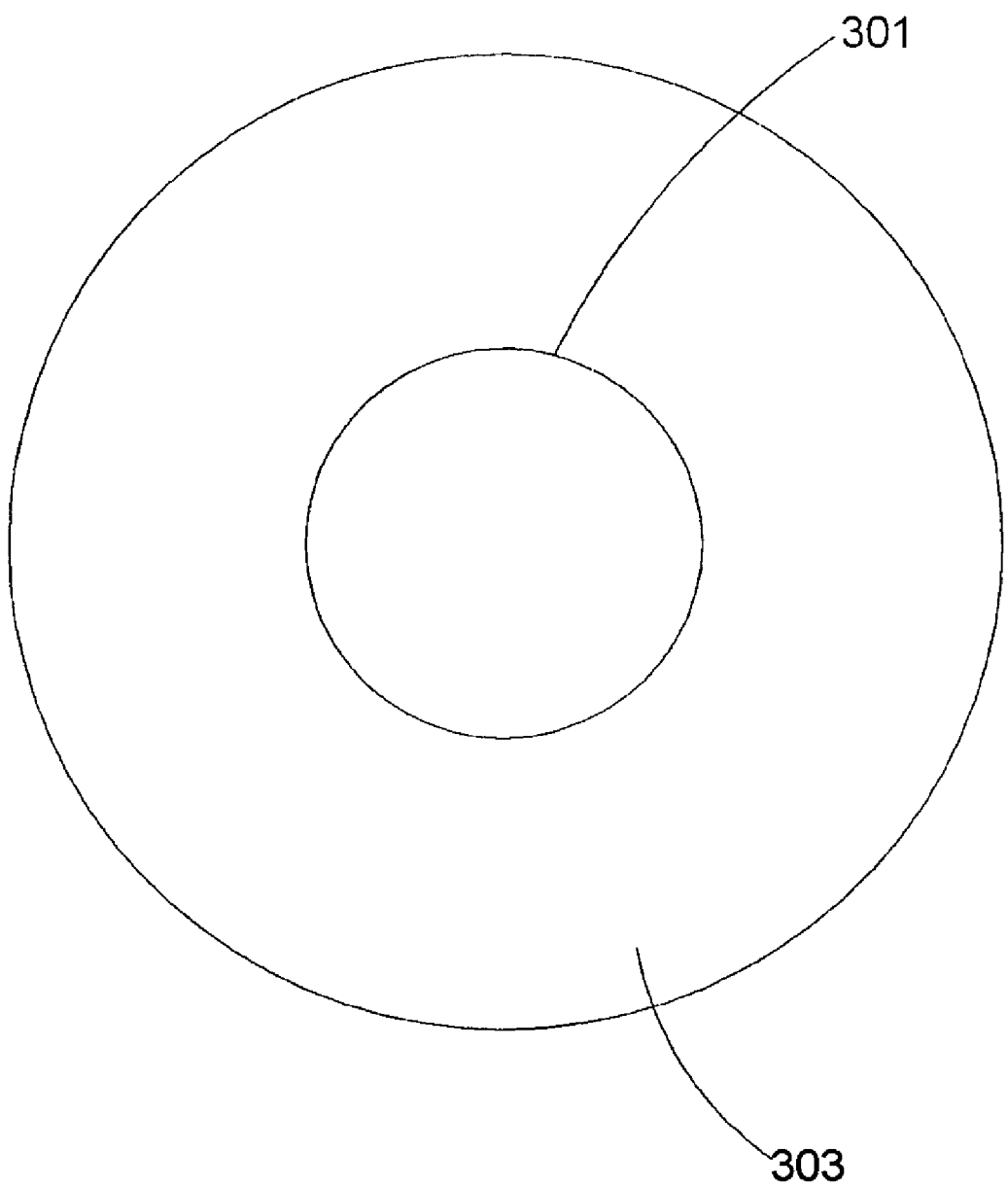
FIG. 3 shows a first power via in accordance with an embodiment of the invention.

FIG. 3 shows a first power via 300 in accordance with an embodiment of the invention. The via 300 comprises a pad 303 that is formed by a conductive material and a plated hole 301. The plated hole 301 (which may be a through hole, blind hole, or buried hole) is made by creating a hole (by means of mechanical or laser drilling, plasma etching, or other method) through as many layers as necessary, and then with chemical processes by adding conductive material throughout the entire depth of the hole (also referred in the industry as its barrel) that ensures electrical connectivity to all layers of the PCB 101. The pad 303 typically resides on a layer of the PCB 101 and supplies electrical power to an associated component through traces that connect to component. The dimensions of the via 300 are designed to accommodate power requirements of associated electrical load.

Figure 4:
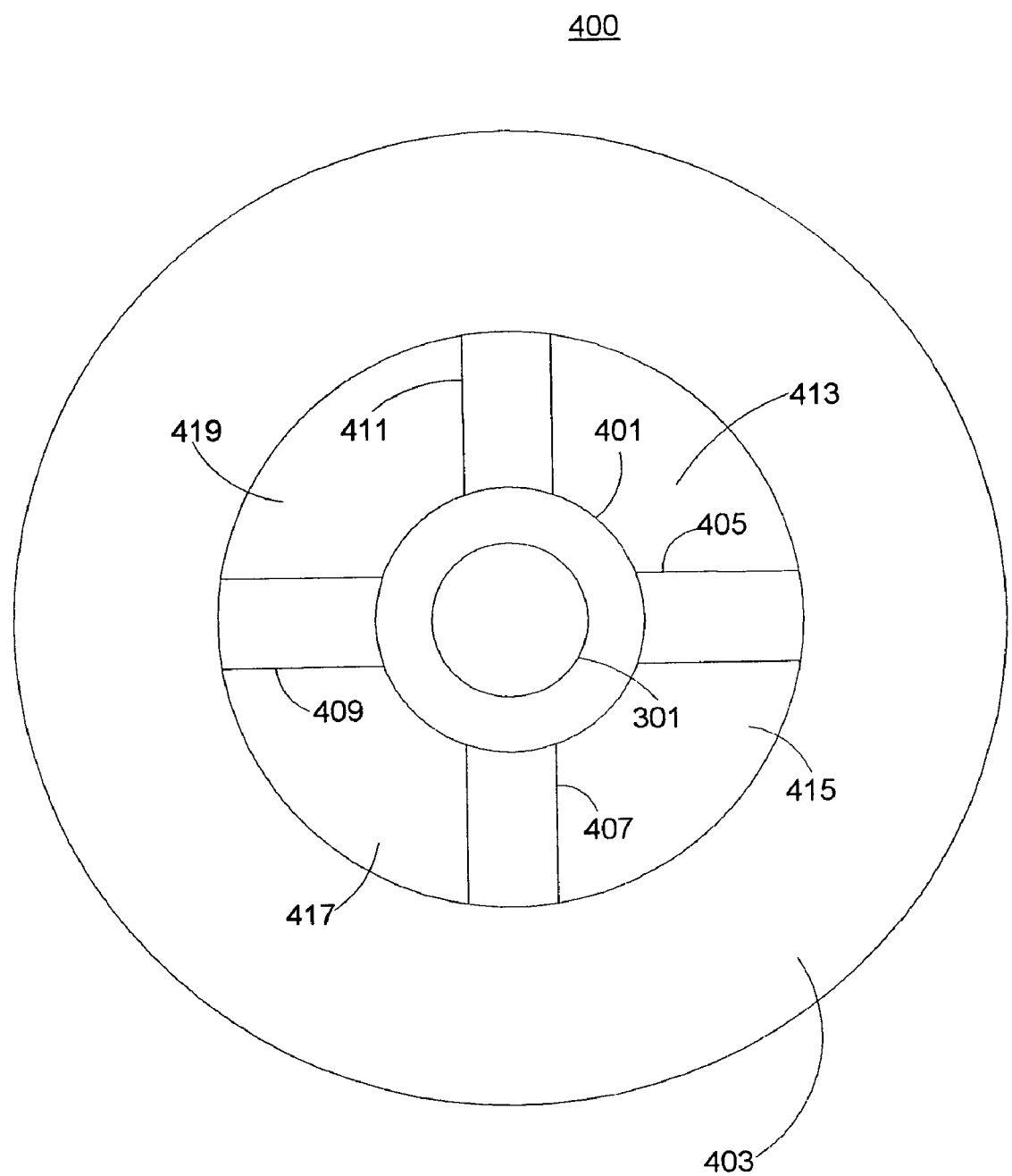
FIG. 4 shows a second power via in accordance with an embodiment of the invention.

FIG. 4 shows a second power via 400 in accordance with an embodiment of the invention. The via 400 comprises a plated hole 401, an annular ring 403, ties 405–411, and thermal gaps 413–419. The plated hole 401 provides an electrical connection between two or more layers of the PCB 101. The annular ring 403 is electrically connected to the plated hole 401 through the ties 405–411. The thermal gaps 413–419 correspond to an absence of conductive material, allowing the conductive material of the ties 405–411 and the annular ring 403 to expand with heating that may occur when providing power to the associated loads.

The embodiment may support other variations of power vias in accordance with power requirements of the associated electrical loads. For example, different electrical loads may require different shapes and different dimensions than the shapes and dimensions that are provided by the power vias 300 and 400.

Figure 5:
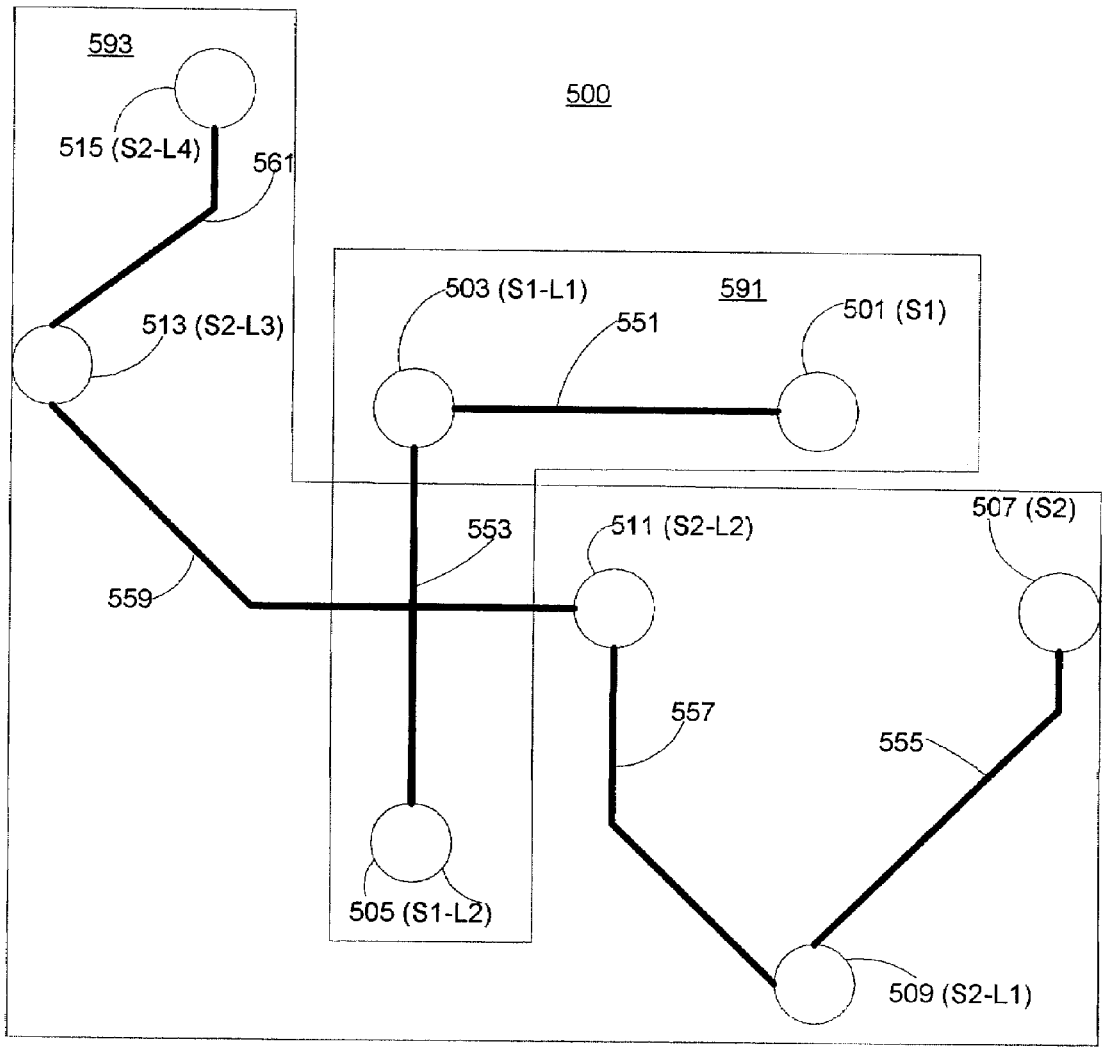
FIG. 5 shows an initial wireframe in accordance with an embodiment of the invention.

FIG. 5 shows an initial wireframe 500 in accordance with an embodiment of the invention. In the embodiment, the initial wireframe 500 corresponds to a single, inner layer of the PCB 101. This inner layer is typically called the split plane layer and is dedicated to supporting the distribution of multiple power potentials (or ground potentials) for the electronic components. In the example, as shown in FIG. 5, the wireframe 500 corresponds to two different power sources 501 and 507 that are connected to corresponding loads. (As an example, the power source 501 may provide power at 5 volts and the power source 507 may provide power at −12 volts.) The power source 501 connects to the loads 503 and 505 though segments 551 and 553, corresponding to a first voltage wireframe. A load (such as the loads 503 and 505 and that may be referred as a power fanout corresponding to a power via) provides electrical power to designated components and corresponds to power connections that may be associated with a fanout via and/or through pins. The power source 507 connects to the loads 509, 511, 513, and 515 through segments 555, 557, 559, and 561, corresponding to a second voltage wireframe. Although the initial wireframe 500 shows the power sources 501 and 507 connecting to the loads in a given order (e.g. the power source 501 connects to the load 503 and then to the load 505), the initial wireframe 500 may connect to the loads in a different order. In the embodiment, the initial ordering of the connections is determined by the ordering of the loads in a right to left direction.

Figure 6:
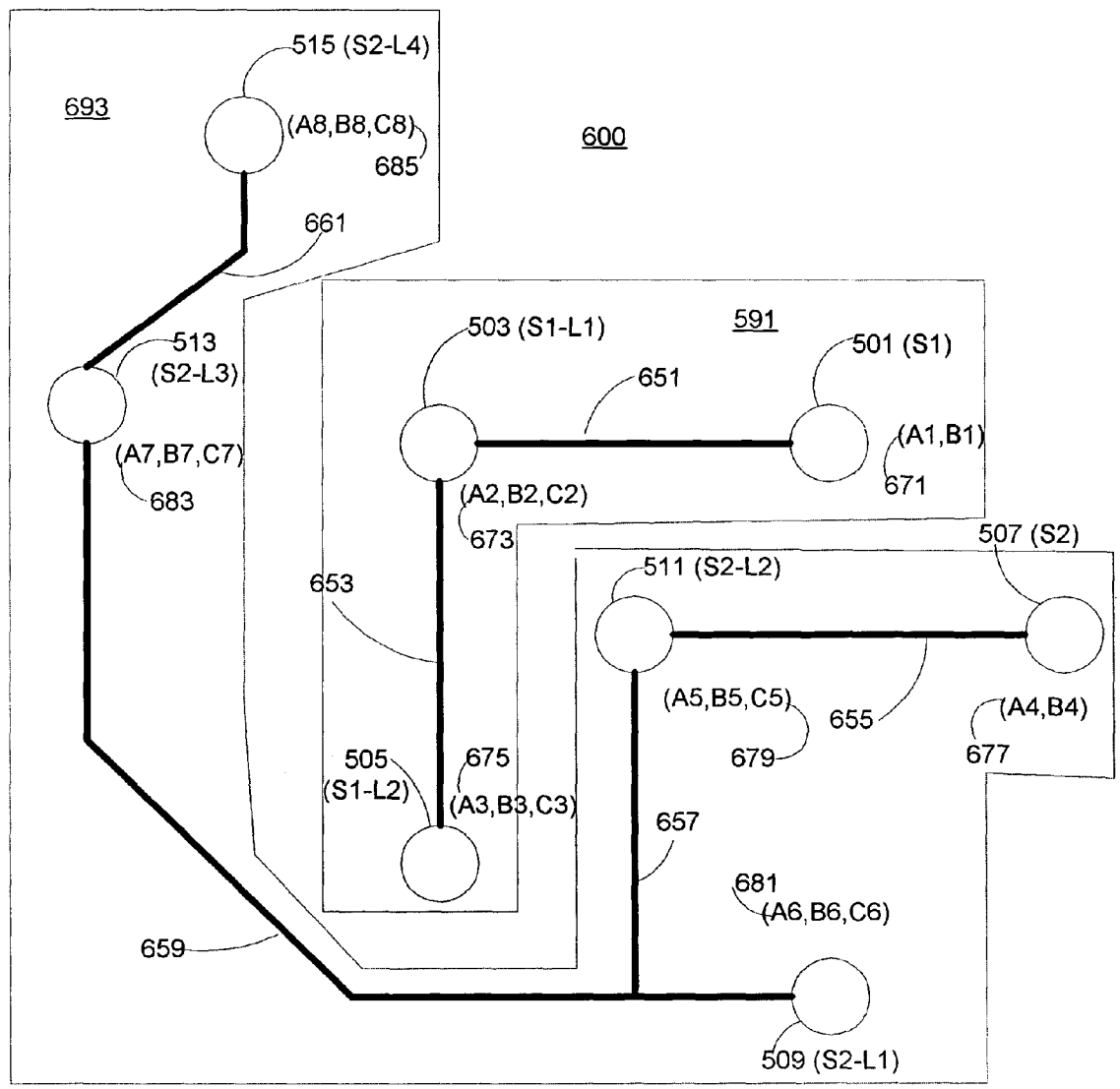
FIG. 6 shows a first enhanced wireframe in accordance with an embodiment of the invention.

FIG. 6 shows a first enhanced wireframe 600 in accordance with an embodiment of the invention. Referring to FIG. 5, a crossover occurs where the segment 559 and the segment 553 intersect. In FIG. 6, the first voltage wireframe 591 is not modified with respect to FIG. 5. A second voltage wireframe 693 is associated with the power source 507 and connects to the loads 509, 511, 513, and 515. However, the second voltage wireframe 593 (as shown in FIG. 5) is transformed (without moving the power vias) in order to eliminate the crossover, forming the second voltage wireframe 693. The segments 555, 557, and 559 as shown in FIG. 5 are replaced with segments 655, 657, and 659. Referring to FIG. 5, the ordering of loads is from the power source 507 to the load 509 to the load 511 to the load 513 to the load 515. In FIG. 6, the ordering of the loads is from the power source 507 to the load 511 to the loads 509 and 513 to the load 515.

Referring to FIG. 6, attributes are associated with each load and with each power source. In the embodiment, two attributes (e.g. a first attribute A1 and a second attribute B1 that are included in an attribute set 671 and that are associated with the power source 501) are associated with each power source, corresponding to an average electrical current and a peak electrical current that are provided by the power source, respectively. Three attributes (e.g. a first attribute A2, a second attribute B2, and a third attribute C2 that are included in an attribute set 673 and that are associated with the load 503) are associated with each load, corresponding to an average electrical current, a peak electrical current and a through electrical current, respectively. For each load, the first attribute (e.g. A2) corresponds to the average electrical current required by the load (e.g. the load 503), the second attribute (e.g. B2) corresponds to the peak electrical current required by the load, and the third attribute (e.g. C2) corresponds to the sum of electrical currents that are required by the load and subsequent loads. In the embodiment, the third attribute references the sum of peak electrical currents, although the sum of average electrical currents may be used in other embodiments.

Figure 7:
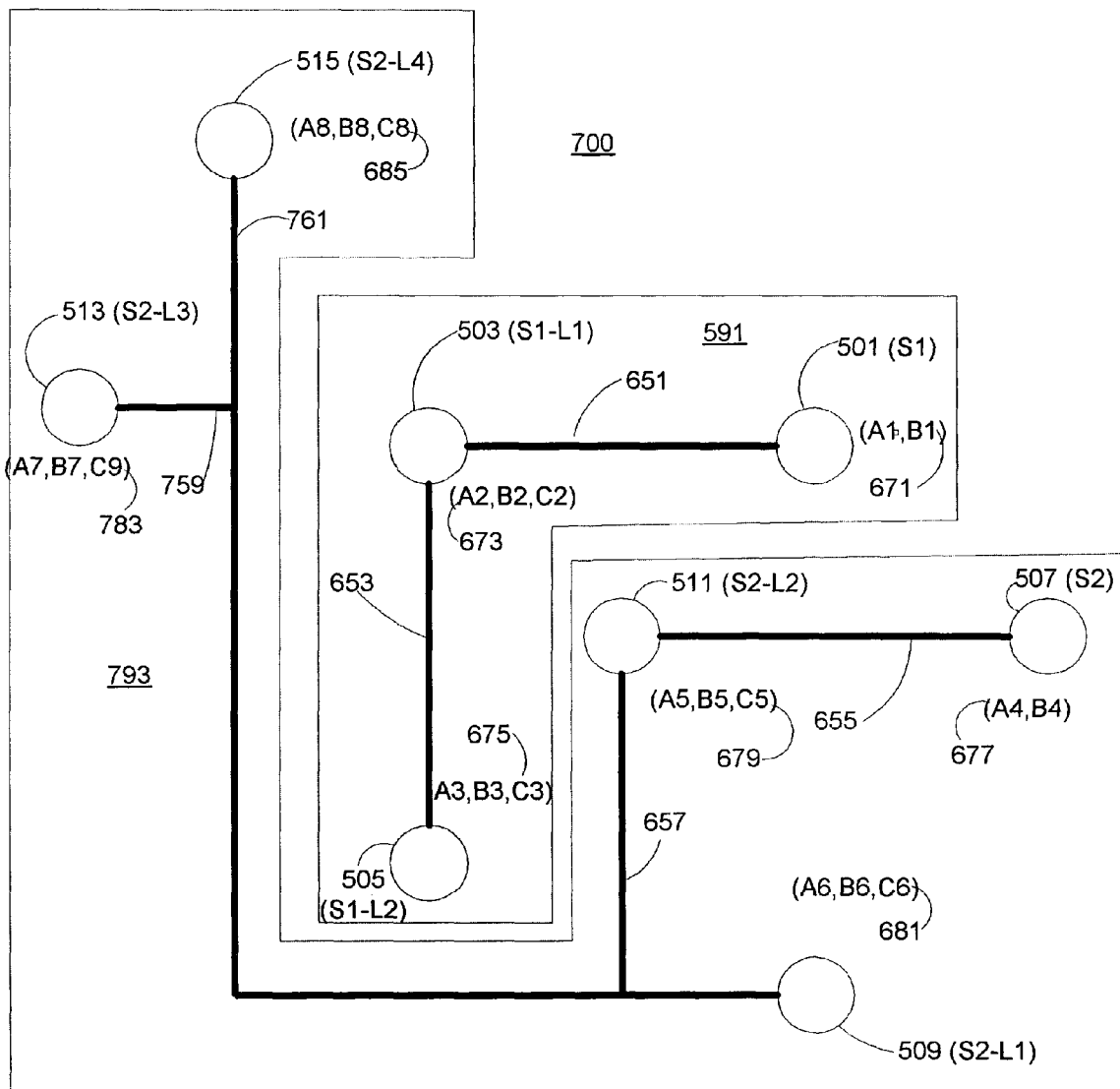
FIG. 7 shows a second enhanced wireframe in accordance with an embodiment of the invention.

FIG. 7 shows a second enhanced wireframe 700 in accordance with an embodiment of the invention. The first voltage wireframe 591 is not modified with respect to FIGS. 5 and 6. A second voltage wireframe 793 comprises the power source 507, the loads 509–515, and segments 655, 657, 759, and 761. Referring to FIG. 6, the segments 659 and 661 are replaced with the segments 759 and 761 in order to reduce the number of vertices. The through electrical current C9 (included in the attribute set 783) that is associated with the load 513 is different for the wireframe 793 than for the wireframe 693. With the wireframe 693, the through electrical current for the load 513 includes both the current requirements for both the loads 513 and 515. However with the wireframe 793, the through electrical current for the load 513 only includes the current requirements only for the load 513. (The average and peak currents A7 and B7 consumed by load 513 are the same for the wireframes 693 and 793.)

Figure 8:
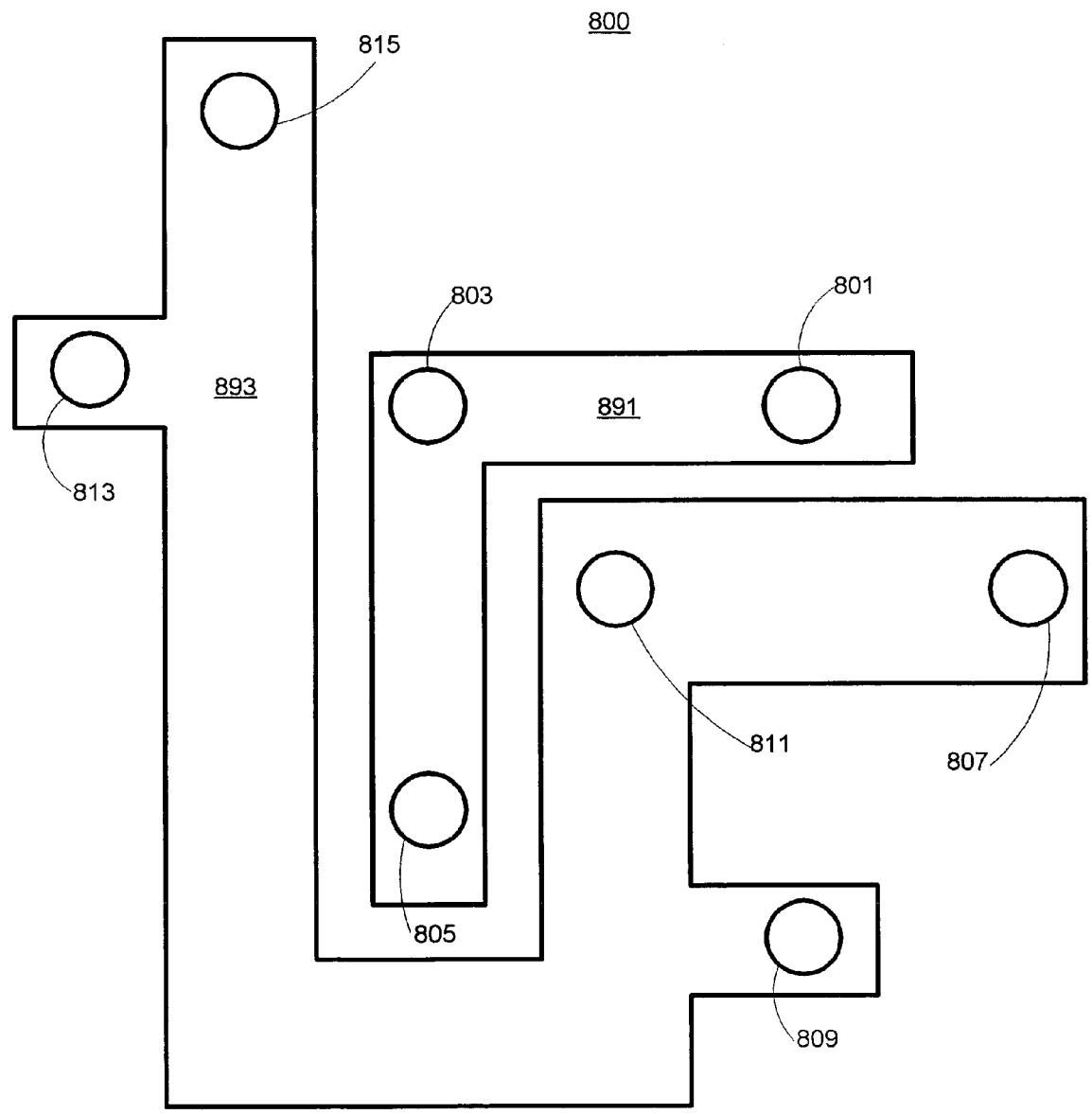
FIG. 8 shows a trace layout in accordance with an embodiment of the invention.

FIG. 8 shows a trace layout 800 in accordance with an embodiment of the invention. A first plane 891 (which may referred as a constituent plane of the split power plane) corresponds to the first voltage wireframe 591 (as shown in FIGS. 5, 6, and 7) and a second plane 893 corresponds to the second voltage wireframe 793 (as shown in FIG. 7). The dimensions of the planes 891 and 893 are determined from the attributes 671–679, 685, and 783. In the embodiment, signal vias, which are situated within a trace, are moved if possible. Also, if a plane intersects or is within a milling path, the plane may be modified or the milling path may be moved. The plane may be modified by adding more vertices. In the embodiment, a clean path (in which the plane is not affected by vias) is provided for each segment if possible.

Figure 9:
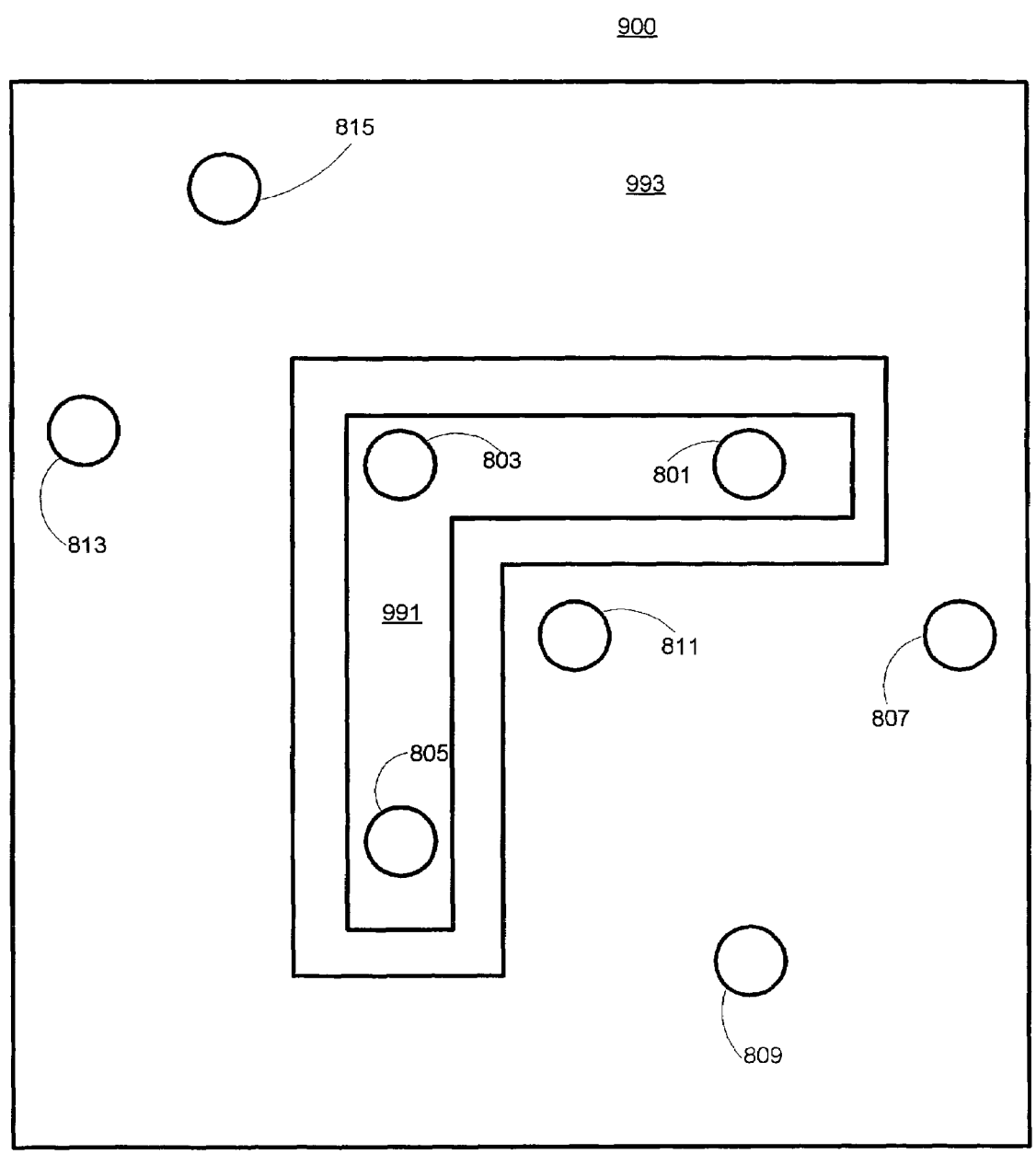
FIG. 9 shows a plane enhancement of the second enhanced wireframe as shown in FIG. 8.

FIG. 9 shows a plane enhancement 900 corresponding to the trace layout shown in FIG. 8. The plane enhancement 900 provides at least the current capacity of the trace layout 800 as well as enhances the split power plane in order to increase electrical isolation with other planes and to increase fabrication efficiency of the PCB. The plane enhancement 900 may utilize a greater portion of an available area to improve electrical characteristics of the PCB as provided by the trace layout 800. For example, an enhanced plane 993 (as shown in FIG. 9) occupies a larger portion of the available area of a PCB layer than does the plane 893 (as shown in FIG. 8).

Enhancing the error-minimized wireframe into the maximized copper planes for each potential of the split power plane may be based on electrical considerations and/or manufacturing considerations. Some electrical considerations that may affect the enhancement of the wireframe are a circuit-critical isolation between potentials (e.g. a potential may need to have more isolation between itself and all of the other potentials in order to pass a hi-pot voltage test of 1.2 KV), a location of where the potential is with respect to other potentials, and/or a quantity of vias for each potential of the circuit. Some manufacturing considerations that may affect the enhancement of the wireframe are a location of the potential with respect to the components on one or both sides of the PCB that may cause an uneven surface for placing certain devices (i.e. 1000+pin ball-grid arrays (BGAs), a proximity of a plane to mechanical features of the design (e.g. non-plated through holes, areas of the design where board material has been removed by milling or other processes), and/or a trade-off between maximizing any/all plane potentials vs. using copper balancing (e.g. copper thieving patterns on the outer layers of a PCB and copper venting patterns on the inner layers of a PCB). Once electrical and/or manufacturing considerations have been analyzed, there are numerous ways of enhancing the wireframe into becoming the desired physical copper planes. An example of enhancing the wireframe into planes may commence by starting with the potential with the least quantity of power vias and increasing the width of the wireframe to a predetermined value (without violating self-net violations, and/or route obstructs, and/or plane obstructs, and/or areas pre-defined for copper balancing) and onto the next-largest quantity of power vias, and so on, up to the potential with the greatest quantity of power vias. This process will be repeated (while increasing the width value), until the wireframe has grown into consuming all of the available area on the layer. By this action, each respective potential of the enhanced wireframe are now considered power planes.

Figure 10:
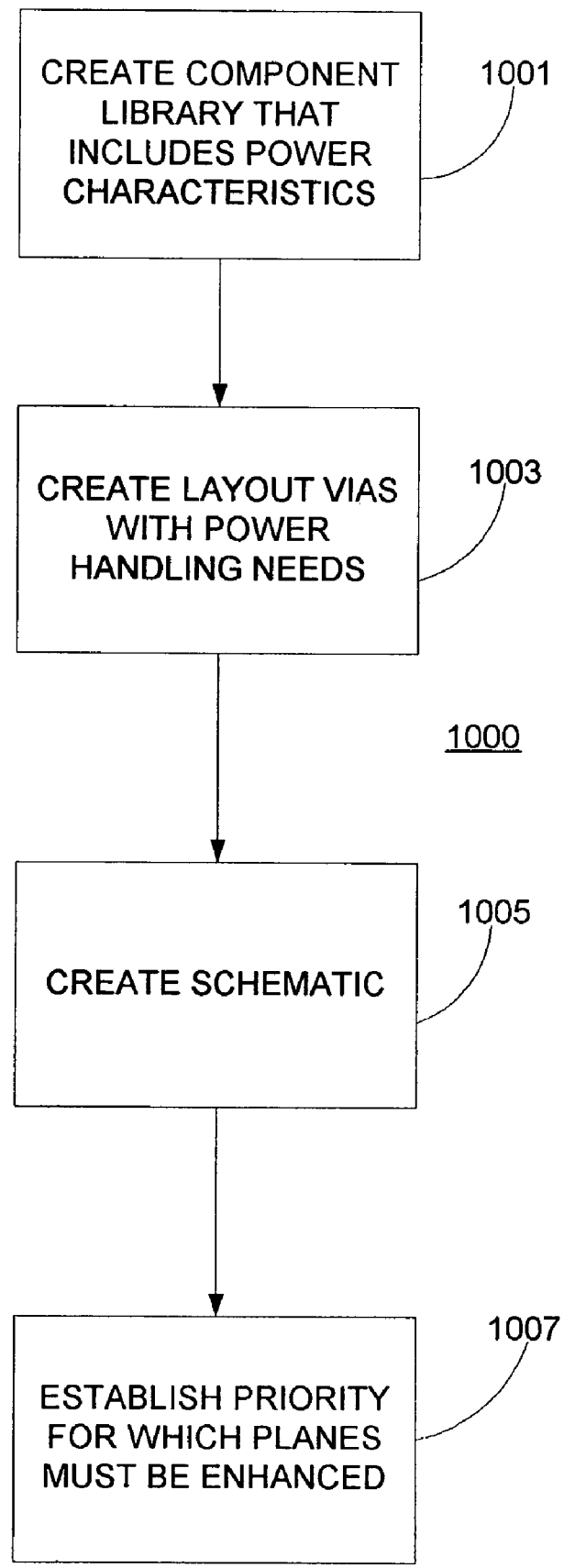
FIG. 10 shows a computer aided engineering (CAE) process in accordance with an embodiment of the invention.

FIG. 10 shows a computer aided engineering (CAE) process 1000 in accordance with an embodiment of the invention. In step 1001, process 1000 creates a component library that associates electrical characteristics with components. The components may be populated on the PCB 101. In the embodiment, the associated electrical characteristics include power characteristics, e.g. average electrical current and peak electrical current requirements. In step 1003, a collection of power vias is created, where each power via is capable of handling specified power requirements. For example, the power via 300 (as shown in FIG. 3) may be able to handle a first maximum average electrical current and the power via 400 (as shown in FIG. 4) may be able to handle a second maximum average electrical current, where the second maximum average electrical current is larger than the first maximum average electrical current. In process 1100 (as described with FIG. 11), the system and/or user select the appropriate power via from the component library, based on the layer stackup created (the quantity of individual layers of all PCB fabrication materials and its final desired thickness after all fabrication processes create the PCB 101) to complete the electronic circuit. The process 1100, may select a power via that utilizes the smallest area for its pad and that can handle the specified electrical current for a load. In step 1005, a schematic of an electrical circuit to be implemented on the PCB 101 is created. In step 1007, a priority of enhancing the planes of a split power layer is determined. In the embodiment, the process 1000 uses the total peak electrical current that is required for each plane, where the priority is greater with a greater total peak current. For example, referring to FIG. 8, the components associated with the trace 893 may require a greater peak electrical current than the components associated with the trace 891. That being the case, the plane for trace 893 (corresponding to 993 in FIG. 9) is enhanced before the plane for the trace 891 (corresponding to plane 991 as shown in FIG. 9).

Figure 11:
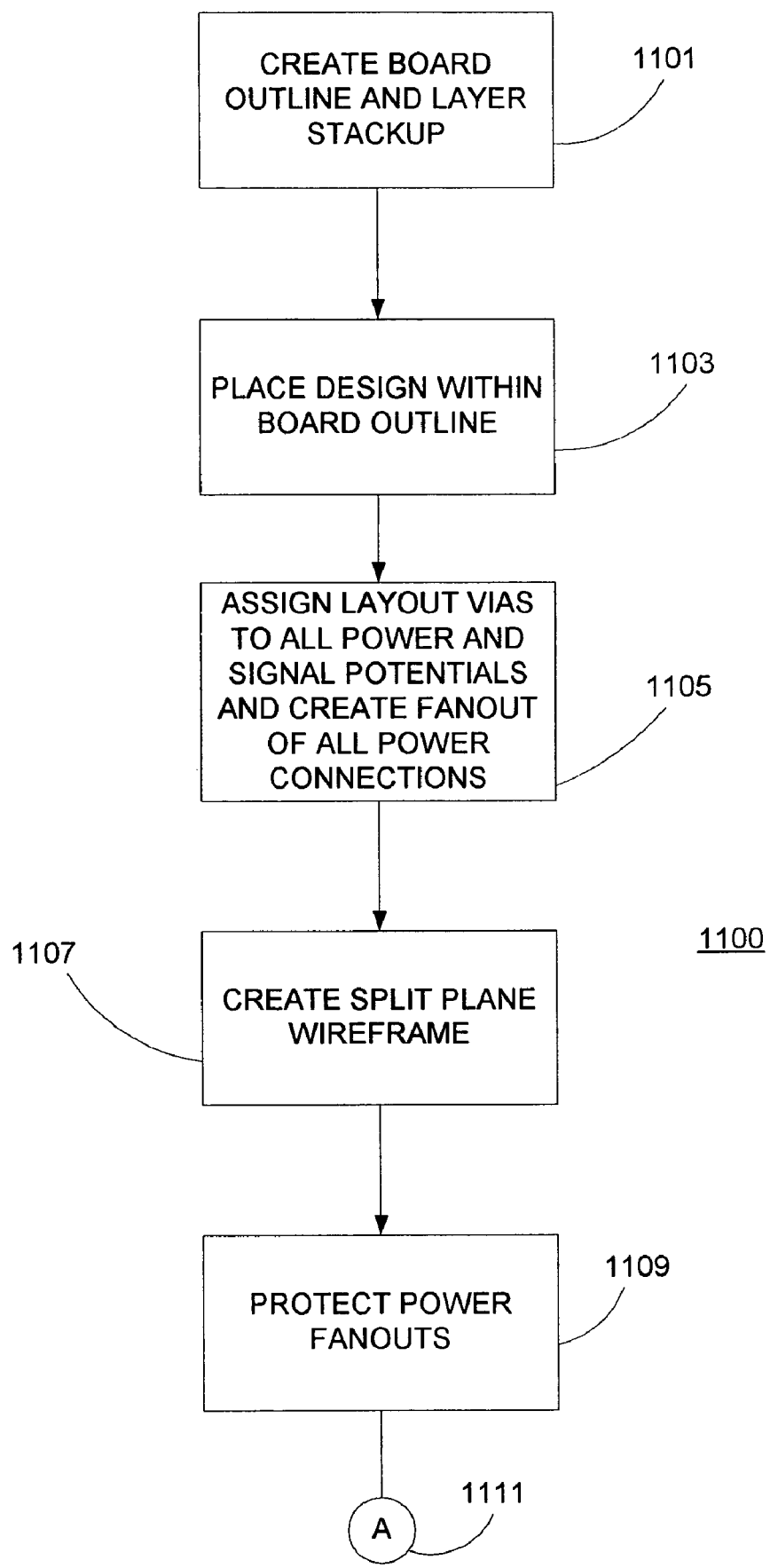
FIG. 11 shows a computer aided design (CAD) process that performs a generation of a split power plane in accordance with an embodiment of the invention.

FIG. 11 shows a computer aided design (CAD) process 1100 that performs a generation of a split power plane in accordance with an embodiment of the invention. In step 1101, a board outline and the layer stackup are created for the PCB 101. The board outline has an area that is adequate to accommodate all the components of the circuit schematic created in step 1005 (as shown in FIG. 5), and the layer stackup provides a sufficient number of layers to properly complete all of the circuit's power and signal connections by means of traces, vias, and copper planes. In step 1103, the components are initially positioned with the board outline. However, the components may be repositioned in subsequent steps. In step 1105, fanouts (which may be referred to as a load as shown in FIGS. 5–7) of all power connections are created. A fanout is associated with at least one component, where the fanout has an associated average electrical current that is a sum of the average electrical currents of the individual components. In addition, the fanout may include a corresponding peak electrical current, which is a sum of the peak electrical currents of the individual components. When a split plane wireframe is created, as discussed in step 1107, each source and load of every potential is associated with a correct power via (placed during the fanout) to handle worst-case current requirements.

In step 1107, the split plane wireframe is constructed, where the power fanouts, as determined in step 1105, are connected. The power fanouts (loads) are connected in an order that corresponds to current flow from a power source to the loads (e.g. the first voltage wireframe 591, where the source 501 is connected to the load 503 and then to the load 505 as shown in FIG. 5). Also, as discussed in the context of FIGS. 5–7, in step 1107 the process 1100 attempts to eliminate crossovers between different wireframes (e.g. the crossover between the voltage wireframe 591 and the voltage wireframe 593 as shown in FIG. 5). Once the quantity of crossovers has been eliminated or reduced to as few as necessary (as will be discussed in more detail with FIG. 13), a trace layout (e.g. the trace layout 800 as shown in FIG. 8) is created in accordance with the electrical current requirements of the fanouts.

Figure 13:
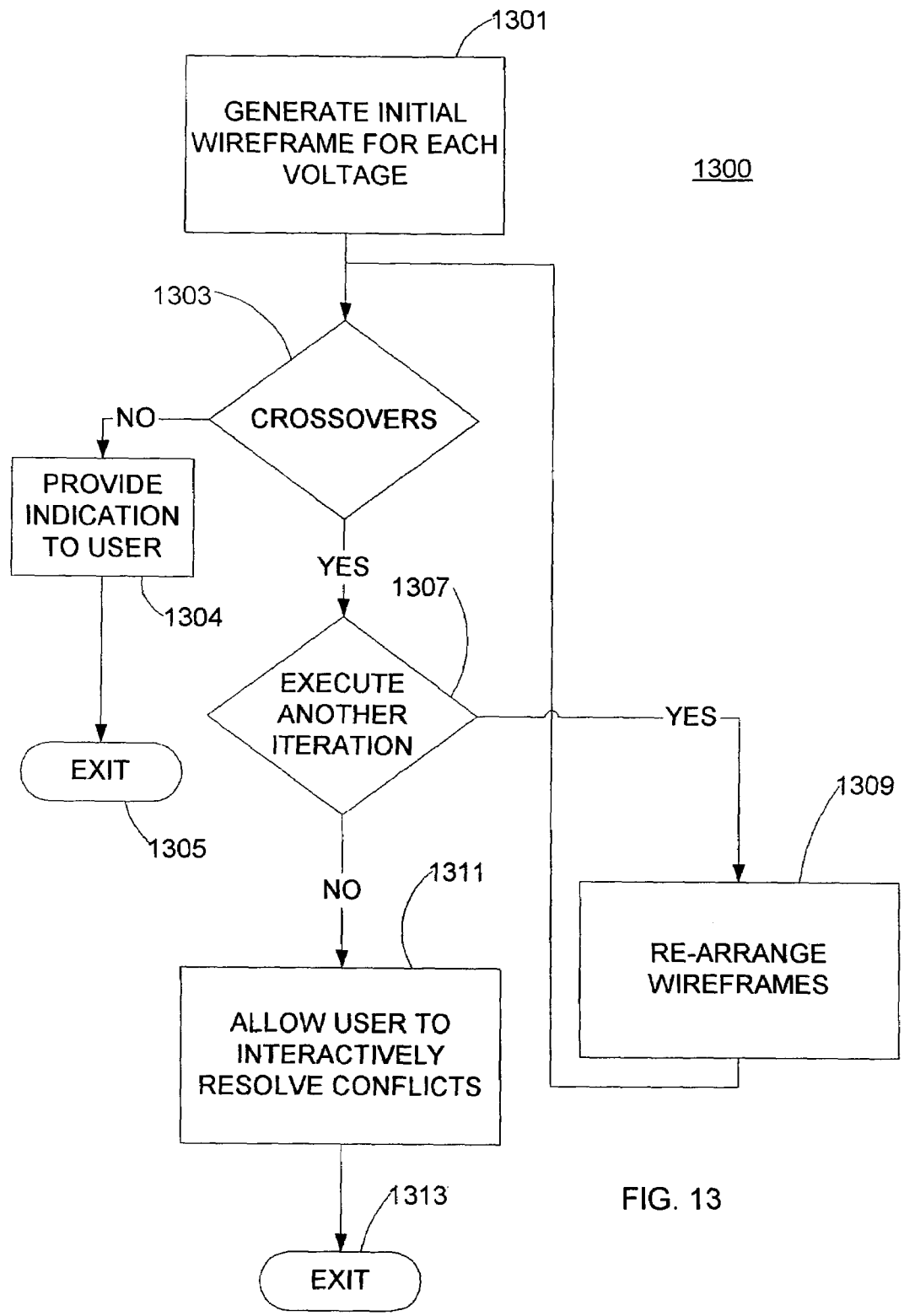
FIG. 13 shows a flow diagram of a sub-process for generating a split plane wireframe in accordance with an embodiment of the invention.

FIG. 13 shows a flow diagram of a sub-process 1300 for generating a split plane wireframe, corresponding to step 1107. In step 1301, an initial wireframe for each power voltage value is generated from the power fanouts (loads), e.g. the split power wireframe 500 that is shown in FIG. 5. If a crossover exists (e.g. the intersection of the segment 553 and the segment 559) as determined in step 1303, step 1307 determines whether the sub-process 1300 is configured to execute another iteration to reduce the quantity of crossovers. If so, step 1309 is executed to eliminate a designated crossover by reconfiguring at least one of the voltage wireframes (e.g. the voltage wireframe 593 as shown in FIG. 5), and step 1303 is consequently repeated. If step 1303 determines that no crossovers exist, step 1304 provides to an indication to the user.

If step 1307 determines that another iteration of the process 1300 shall not be executed, the process 1300 allows the user to interactively resolve crossover conflicts in step 1311. The user may move at least one power via and/or components to eliminate the designated crossover. Alternatively, the user may route one of the crossover segments on a different layer from the split power plane. In an embodiment, the process 1300 may automatically execute step 1311 where the process 1300 performs an appropriate routing rather than requiring user intervention.

Referring to FIG. 11, after the completion of step 1107, the power fanouts are protected in step 1109 so that the locations of the corresponding power vias are not changed in selected subsequent steps.

Figure 12:
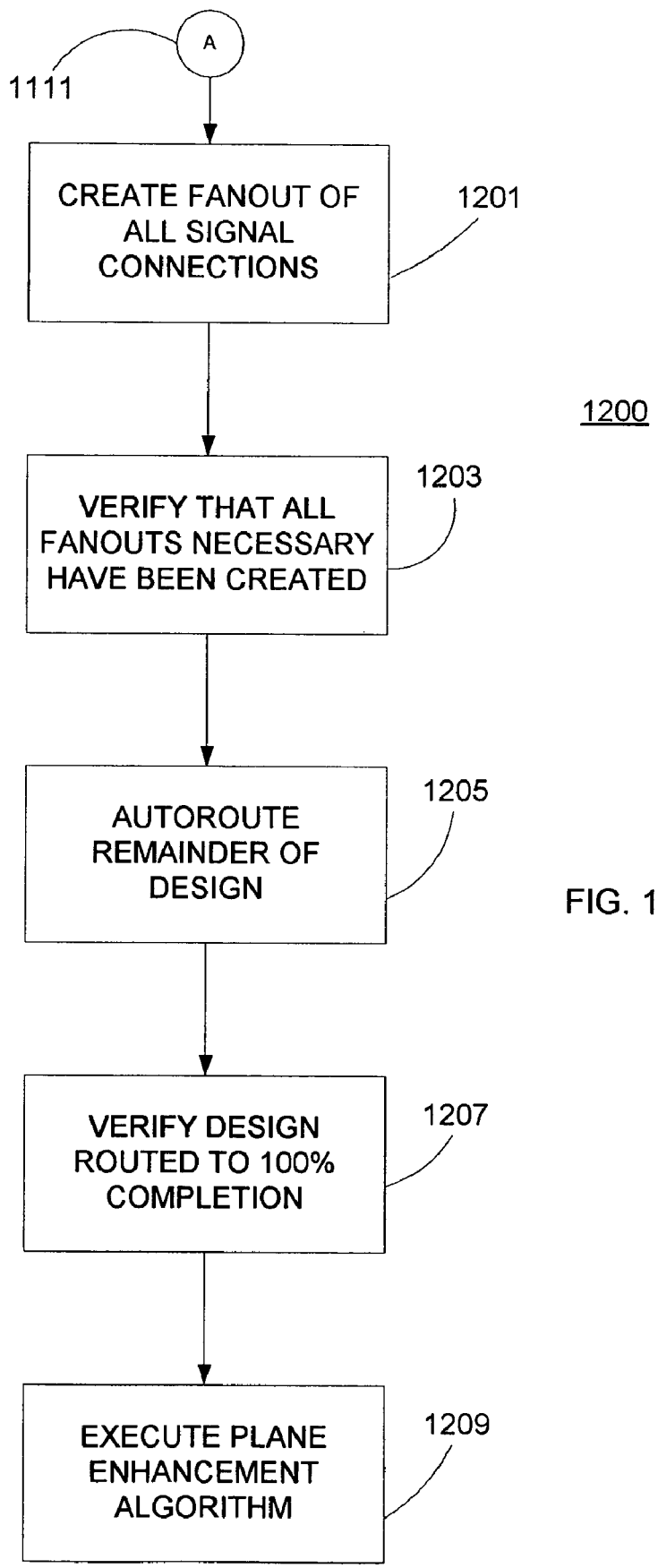
FIG. 12 is a continuation of the process as shown in FIG. 11.

FIG. 12 is a continuation of the process 1100 as shown in FIG. 11. In step 1201, fanouts for signal connections (which correspond to remaining connections that do not distribute power to the components) are created. If a signal fanout is located within a trace segment, process 1200 attempts to move the signal fanout (via) from the trace segment. In step 1203, the process 1200 verifies that all fanouts have been created in accordance with the circuit schematic that was created in step 1005 as shown in FIG. 10. In step 1205, the process 1200 completes the trace layout for the signal vias that are identified in steps 1201 and 1203. In step 1207, the process 1200 pauses, enabling the user to verify that the processes 1100 and 1200 have completed the trace layout of the circuit design. In a variation of the embodiment, the user may configure the process 1200 to circumvent step 1207 and to proceed with step 1209. In step 1209, planes (e.g. the planes 891 and 893 as shown in FIG. 8) of the split power layer are enhanced in order to achieve desired electrical characteristics and may utilize the available area of the split power plane. Enhancement of the planes is prioritized in the order as determined by step 1007 as shown in FIG. 10.

Referring to FIGS. 11–13, the processes 1100, 1200, and 1300 collectively support a generation of a split power plane for a multi-layer PCB. In the embodiment, the processes 1100, 1200, and 1300 enable a user to interactively intervene during the generation of the split power plane. However, a variation of the embodiment may generate all steps shown in FIGS. 11–13 without intervention by the user. An example of this variation is editing the design (moving components around, adding and/or deleting components, etc.) and then checking to determine whether or not the wireframe needs to be either modified or completely regenerated.

Figure 14:
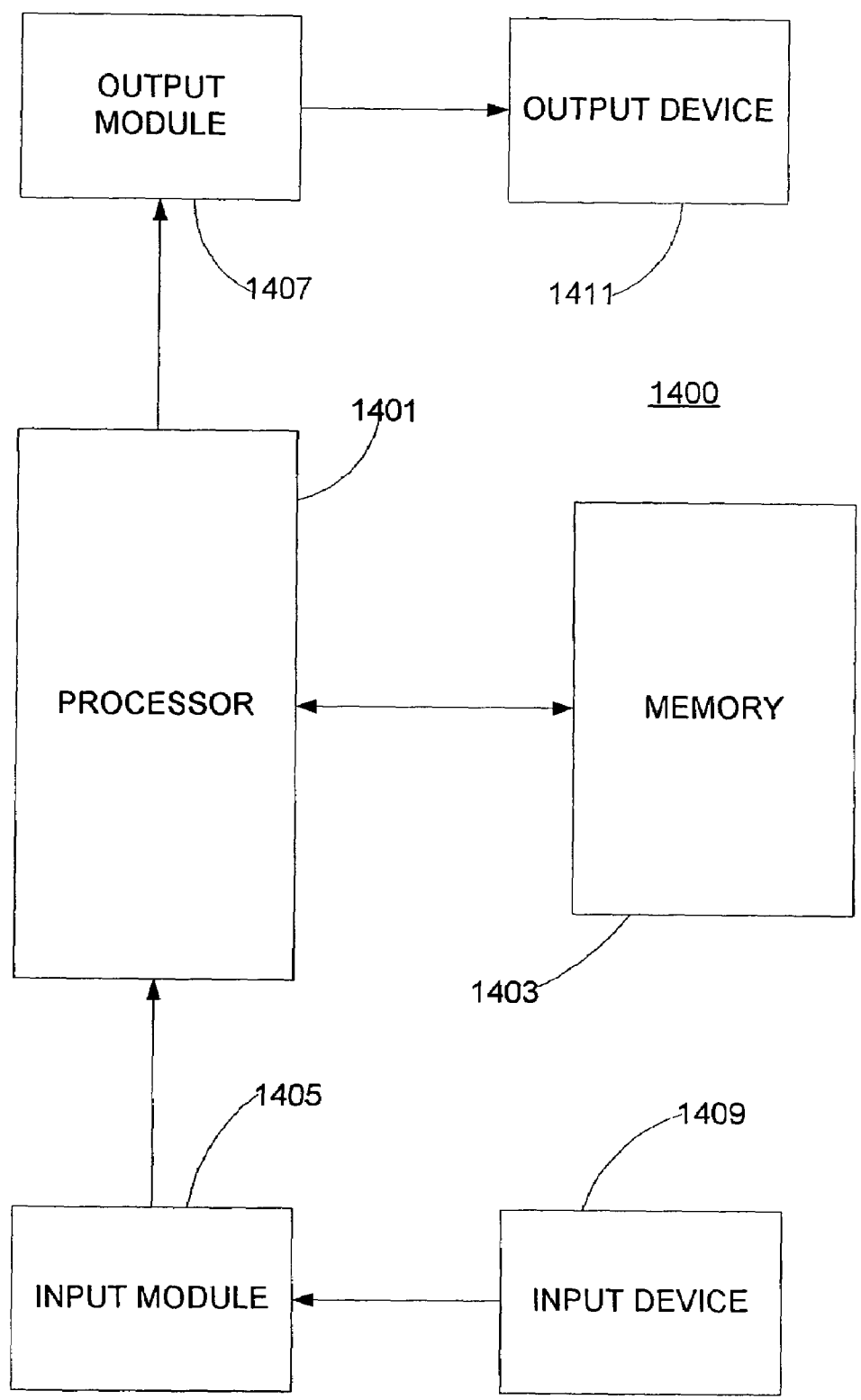
FIG. 14 shows an apparatus that generates a split power plane in accordance with an embodiment of the invention.

FIG. 14 shows an apparatus 1400 that generates a split plane power plane for a multi-layer PCB in accordance with an embodiment of the invention. The apparatus 1400 comprises a processor 1401, a memory 1403, an input module 1405, an output module 1407, an input device 1409, and an output device 1411. The apparatus 1400 may be implemented on a computer-based platform (e.g. a personal computer), with specialized hardware (e.g. an application specific integrated circuit), or with hardware that enables computer-executable instructions to execute on a computer-based platform.

In the embodiment, the processor 1401 executes computer-executable instructions that correspond to the processes 1000, 1100, 1200, and 1300 and that are accessed from the memory 1403. The processor 1401 obtains design requirements from the input module 1405. In the embodiment, the input module 1405 interfaces with a user device 1409 though which a user can specify design requirements. In another embodiment, the input module 1405 supports an internal interface, e.g. with the memory 1401, in which design requirements are provided by previously executed applications software that runs on the apparatus 1400, or supports an interface to a memory peripheral device, in which design requirements are provided by contents on a memory medium.

The processor 1401 obtains design results and provides the design results to the output module 1407 to an output device 1411 for the user's viewing. In another embodiment, the output module 1407 interfaces with the memory 1401 for applications software that subsequently processes the results or with a memory peripheral device, in which design results are stored as contents on a memory medium.

The methods and apparatuses discussed in the embodiments above may decrease the time to design the split power plane of a multi-layer printed circuit board. Moreover, the electrical characteristics may be improved by designing the split power plane in accordance with the electrical current requirements for each component. With electronic design automation (EDA) tools of the prior art, a device's electrical current attributes (e.g. initial, steady-state, and/or peak) may not be included for an EDA library component because voltage characteristics are typically considered a more general attribute. An embodiment of the invention recognizes electrical current attributes of each library component during the placement and routing phases of the PCB design process.

As can be appreciated by one skilled in the art, a computer system with an associated computer-readable medium containing instructions for controlling the computer system can be utilized to implement the exemplary embodiments that are disclosed herein. The computer system may include at least one computer such as a microprocessor, digital signal processor, and associated peripheral electronic circuitry.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method for generating through electronic data processing at least one split power plane of a multi-layer printed circuit board (PCB), comprising:
    (a) creating a printed circuit board outline;
    (b) determining associated locations of a plurality of components within the PCB outline;
    (c) creating a power fanout that represents an electrical power distribution to each of the plurality of components, the power fanout supporting a plurality of electrical potentials;
    (d) creating a split plane wireframe comprising:
        (i) generating through electronic data processing a plurality of initial voltage wireframes;
        (ii) generating through electronic data processing an enhanced set of voltage wireframes specifying trace paths which account for stored current requirements of associated components and have no or a reduced quantity of crossover, a crossover corresponding to an intersection of different voltage wireframes, the trace paths specified by the enhanced set of voltage wireframes including at least one new trace path not included in the plurality of initial voltage wireframes; and
        (iii) determining through electronic data processing a trace width for each segment of the split plane wireframe in accordance with the stored current requirements of the associated components; and
    (e) creating a first split power plane from the split plane wireframe, the first split power plane comprising a first constituent plane associated with a first voltage and a second constituent plane associated with a second voltage.

2. The method of claim 1, wherein (iii) comprises:
    (1) calculating the trace width in accordance with electrical current requirements of at least one associated electrical load.

3. The method of claim 2, wherein (iii) further comprises:
    (2) if a signal via is situated on a first segment, relocating the signal via.

4. The method of claim 2, wherein (iii) further comprises:
    (2) if a via is located on a trace of a segment, adding a vertex to the segment in order to circumvent the via.

5. The method of claim 2, wherein (iii) further comprises:
    (2) if a via is located on a trace of the segment, moving a milling path; and
    (3) reconfiguring the segment.

6. The method of claim 1, wherein (ii) comprises: (1) if a first crossover exists between a first voltage wireframe and a second voltage wireframe, reconfiguring at least one voltage wireframe to eliminate the first crossover.

7. The method of claim 6, wherein (ii) further comprises: (2) if another crossover exists between the first voltage wireframe and the second voltage wireframe, reconfiguring the at least one voltage wireframe to eliminate the other crossover.

8. The method of claim 1, wherein a segment is associated with a plurality of electrical loads, and wherein (iii) comprises:
    (1) rearranging an ordering of the plurality of electrical loads to reduce a number of vertices of the segment.

9. The method of claim 1, wherein a first electrical load is associated with a segment, and wherein the electrical requirements account for a first peak current requirement of the first electrical load.

10. The method of claim 9, wherein another electrical load is associated with the segment, and wherein the electrical requirements comprise another peak current requirement of the other electrical load, and wherein (iii) comprises:
    (1) adding the first peak current requirement to the other peak current requirement to determine the electrical requirements; and
    (2) in response to (1), calculating the trace width of the segment.

11. The method of claim 1, wherein a first electrical load is associated with a segment, and wherein the electrical requirements account for a first average current requirement of the first electrical load.

12. The method of claim 11, wherein another electrical load is associated with the segment, and wherein the electrical requirements comprise another average current requirement of the other electrical load, and wherein (iii) comprises:
(1) adding the first average current requirement to the other average current requirement to determine the electrical requirements; and
(2) in response to (1), calculating the trace width of the segment.

13. The method of claim 1, wherein (ii) comprises:
(1) if a crossover exists between a first voltage wireframe and a second voltage wireframe, moving at least one via, wherein the at least one via provides electrical power to one of the plurality of components.

14. The method of claim 1, wherein (ii) comprises:
(1) if the crossover exists between the first voltage wireframe and the second wireframe, moving one of the plurality of the components.

15. The method of claim 1, wherein (ii) comprises:
(1) if the crossover exists between a first voltage wireframe and a second voltage wireframe, routing a segment on a different layer of the multi-layer PCB.

16. The method of claim 1, wherein (d) further comprises:
(iv) reconfiguring the split plane wireframe to avoid at least one impediment, wherein the impediment is selected from the group consisting of a milling path, a route obstruct, a plane obstruct, and a route border.

17. The method of claim 1, wherein (e) comprises:
(i) increasing an area of one of the constituent planes in accordance with the printed circuit board outline.

18. The method of claim 17, wherein (e) further comprises:
(ii) balancing a first area of the first constituent plane and a second area of the second constituent plane.

19. A computer-readable medium having computer-executable instructions for performing the method recited in claim 17.

20. The method of claim 1, wherein (i) comprises:
(1) connecting a first electrical load with a second electrical load with a wireframe connection selected from the group consisting of a horizontal connection, a vertical connection, and a 45-degree connection.

21. The method of claim 1, further comprising:
(f) repeating (d) and (e) to form another split power plane to support additional electrical potentials.

22. The method of claim 1, wherein at least one of the electrical potentials corresponds to a ground potential.

23. The method of claim 1, further comprising:
(f) creating a second split power plane from the split plane wireframe, wherein the second split power plane resides on a different layer of the multi-layer PCB than does the first split power plane.

24. The method of claim 1, wherein (ii) reduces the quantity of crossovers to zero, thereby eliminating all of the crossovers.

25. A multi-layer printed circuit board having a split power plane designed in accordance with the method of claim 1.

26. A computer-readable medium having computer-executable instructions for performing the method recited in claim 1.

27. An apparatus for routing a split power plane of a multi-layer printed circuit board (PCB), comprising:
an input module;
an output module; and
a processor that is coupled to the input module to obtain circuit requirements and that is coupled to the output module to provide design results for the split power plane, the processor configured to perform:
(a) creating a printed circuit board outline;
(b) determining associated locations of a plurality of components within the PCB outline;
(c) creating a power fanout that represents an electrical power distribution to each of the plurality of components, the power fanout supporting a plurality of electrical potentials;
(d) creating a split plane wireframe comprising:
(i) generating a plurality of initial voltage wireframes;
(ii) generating an enhanced set of voltage wireframes specifying trace paths which account for stored current requirements of associated components and have no or a reduced quantity of crossover, a crossover corresponding to an intersection of different voltage wireframes, the trace paths specified by the enhanced set of voltage wireframes including at least one new trace path not included in the plurality of initial voltage wireframes; and
(iii) determining a trace width for each segment of the split plane wireframe in accordance with the stored current requirements of the associated components; and
(e) creating a first split power plane from the split plane wireframe, the first split power plane comprising a first constituent plane associated with a first voltage and a second constituent plane associated with a second voltage.

28. The apparatus of claim 27, wherein the processor, whenever performing (iii), is configured to perform:
(1) calculating the trace width in accordance with electrical current requirements of at least one associated electrical load.

29. The apparatus of claim 27, wherein the processor, whenever performing (ii), is configured to perform:
(1) if a first crossover exists between a first voltage wireframe and a second voltage wireframe, reconfiguring at least one voltage wireframe to eliminate the first crossover.

30. The apparatus of claim 27, wherein the processor, whenever performing (e), is configured to perform:
(i) increasing an area of one of the constituent planes in accordance with a printed circuit board outline.

31. The apparatus of claim 27, further comprising:
an input device that enables a user to interact with the apparatus.

32. The apparatus of claim 27, further comprising:
an output device that employs the design results.

* * * * *